(12) United States Patent
Cheng et al.

(10) Patent No.: US 10,162,276 B2
(45) Date of Patent: Dec. 25, 2018

(54) APPARATUS FOR SHIELDING RETICLE

(71) Applicant: TAIWAN SEMICONDUCTOR MANUFACTURING COMPANY LTD., Hsinchu (TW)

(72) Inventors: Wen-Hao Cheng, Hsinchu (TW); Chue-San Yoo, Hsinchu (TW); Tsiao-Chen Wu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/093,452

(22) Filed: Apr. 7, 2016

(65) Prior Publication Data

US 2017/0199471 A1 Jul. 13, 2017

Related U.S. Application Data

(60) Provisional application No. 62/276,470, filed on Jan. 8, 2016.

(51) Int. Cl.
| | | |
|---|---|---|
| *G03B 27/42* | (2006.01) | |
| *G03B 27/52* | (2006.01) | |
| *G03F 7/20* | (2006.01) | |
| *H01L 21/67* | (2006.01) | |

(52) U.S. Cl.
CPC .... *G03F 7/70883* (2013.01); *H01L 21/67069* (2013.01)

(58) Field of Classification Search
CPC ............. H01L 21/6831; H01L 21/6833; H01L 21/308; H01J 37/32532; H01J 37/3266; H01J 37/32669
See application file for complete search history.

(56) References Cited

U.S. PATENT DOCUMENTS

| | | | | |
|---|---|---|---|---|
| 6,642,531 B1* | 11/2003 | Powers | ................. | B82Y 10/00 250/372 |
| 6,781,673 B2* | 8/2004 | Moors | ................. | G03F 7/70558 355/53 |
| 6,842,225 B1* | 1/2005 | Irie | ..................... | G03F 7/70475 355/53 |
| 2005/0275835 A1* | 12/2005 | Sogard | ................. | B82Y 10/00 356/237.2 |
| 2009/0128795 A1* | 5/2009 | Hayashi | ................. | G03B 27/62 355/75 |

FOREIGN PATENT DOCUMENTS

| | | |
|---|---|---|
| EP | 1182510 | 2/2002 |
| TW | 200905727 | 2/2009 |

* cited by examiner

*Primary Examiner* — Mesfin Asfaw
(74) *Attorney, Agent, or Firm* — Haynes and Boone, LLP

(57) ABSTRACT

The present disclosure provides an apparatus. The apparatus comprises a field generator, configured to produce a field shield protecting a reticle from foreign particles.

25 Claims, 10 Drawing Sheets

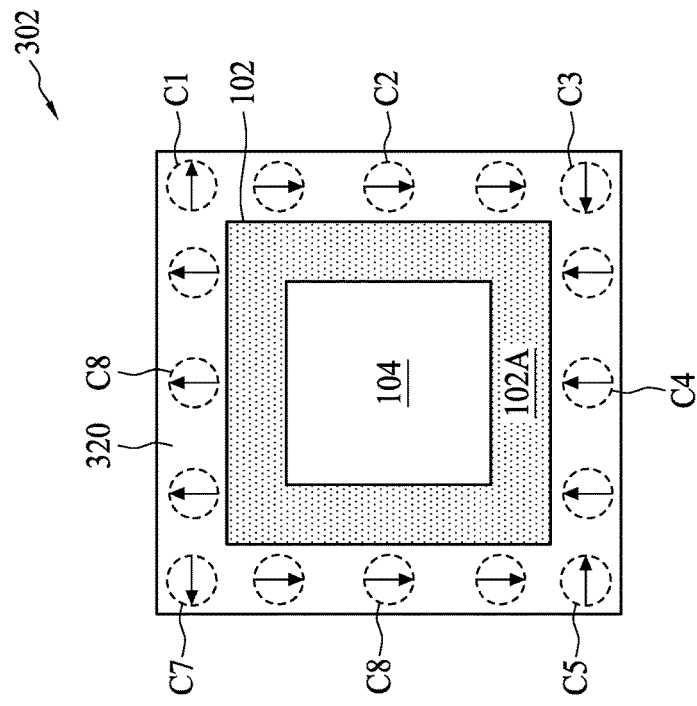
FIG. 2A
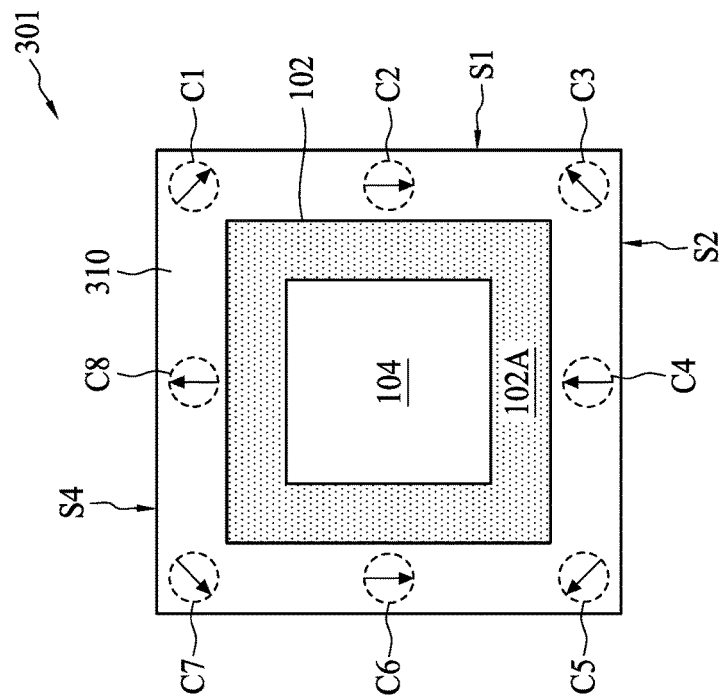
FIG. 2B
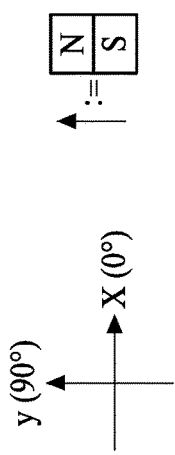

APPARATUS FOR SHIELDING RETICLE

PRIORITY CLAIM AND CROSS-REFERENCE

This application claims priority to U.S. patent application Ser. No. 62/276,470 filed 2016 Jan. 8, the disclosure of which is hereby incorporated by reference in its entirety.

BACKGROUND

Manufacturing of silicon chips or wafers typically involves a myriad of processing steps, such as photolithography. In photolithography, a wafer surface deposited with a photoresist is exposed to a radiation source through a patterned reticle. The radiation source, such as ultraviolet light, travels along a radiation route and is incident on or reflected off a pattern reticle in order to project the patterns of the reticle onto the wafer. The wafer is then subjected to development and etching processes for removing undesired portions while leaving the reticle-defined patterns thereon.

As the industry continues the trend of decreasing device size, the line width on wafers are scaled down and the device count is increased accordingly. On one hand, the fidelity requirement of the reticle pattern is getting more stringent. On the other hand, error-free transformation of the reticle pattern image onto the wafer also plays an important role in determining the quality of the final semiconductor product. As a result, a cleared environment around the pattered reticle is necessary. In addition, it is important to keep the operative surface of the reticle away from foreign particles or contaminants that could otherwise obstruct the traveling path of the radiation or roughen the reticle surface such that the no defects would occur, such as undesired open or closed circuits. Thus, an effective shielding mechanism for the reticle is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2D are schematic views of a field generator of the reticle shielding apparatus in FIG. 1, in accordance with some embodiments of the present disclosure.

DETAILED DESCRIPTION

Figure 1:
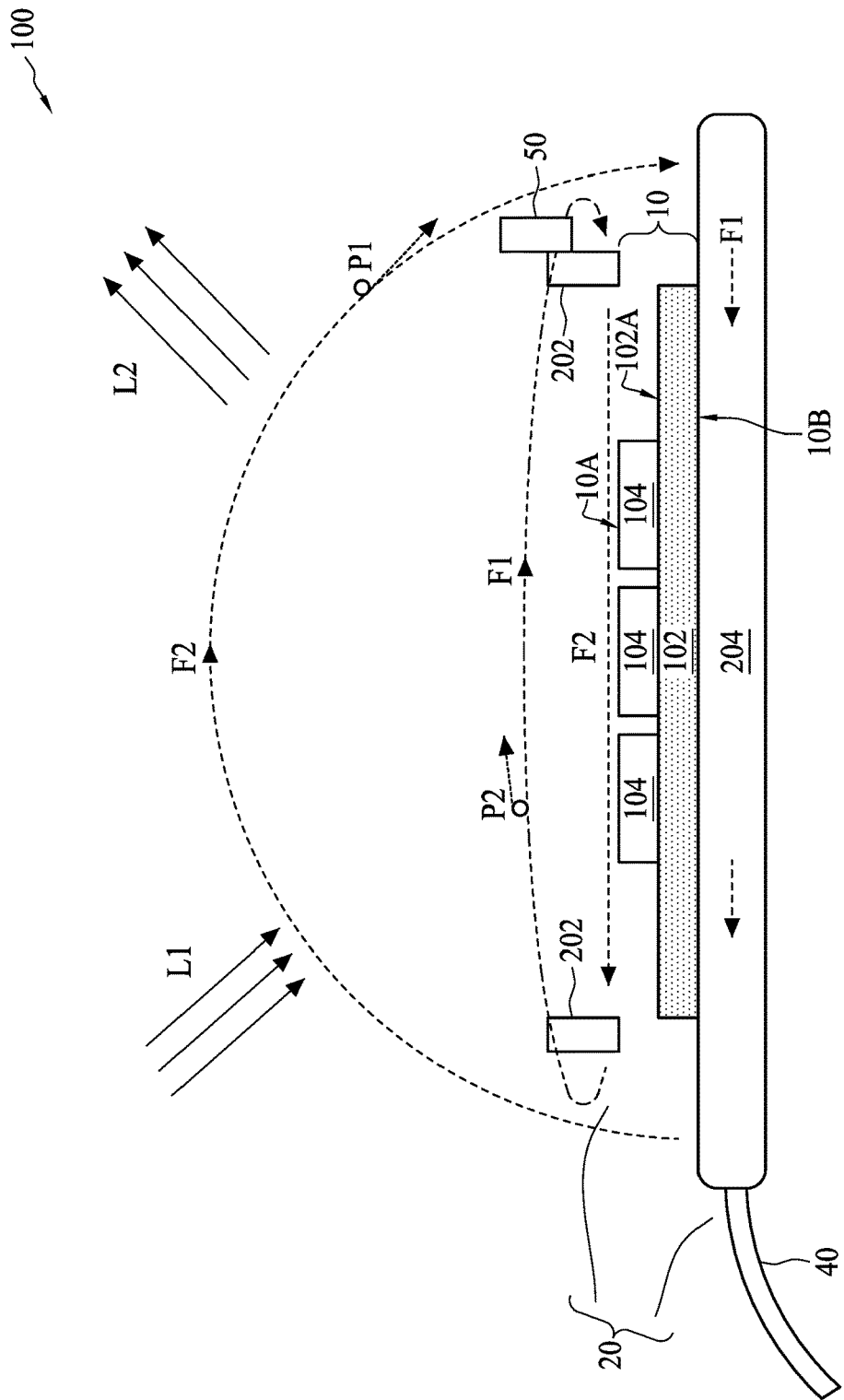
FIG. 1 is a schematic view of a reticle shielding apparatus in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A photomask, or a reticle, is used in a photolithography operation. The reticle is configured to provide defined patterns for fabrication of semiconductor circuits. The defined patterns arranged on the reticle are transformed onto the wafer surface. However, foreign particles appearing in the travelled path of the radiation source for photolithography may interfere with the exposure operation and affect the resultant circuit performance. Conversely, any additional protection mechanism may complicate the handling and inspection operations for the reticle. Therefore, it is a challenge to control the exposure environment to be contaminant-free while maintaining the exposing process efficiently.

The present disclosure presents an apparatus configured to shield the reticle from foreign particles or any other contaminants that would otherwise attach to the wafer surface or obstruct the traveling path of radiation. The apparatus is configured to move the undesired particles away from the surface of the reticle by using a type of field energy. Thus, the reticle can be protected from particle contamination in an effective manner.

FIG. 1 is a schematic view of a reticle shielding apparatus 100 in accordance with some embodiments of the present disclosure. The reticle shielding apparatus 100 comprises a reticle 10 and a field regenerator 20.

The reticle 10 comprises a substrate 102 and a patterned layer 104. In addition, the reticle 10 comprises a first side 10A and a second side 10B opposite the first side 10A. The first side 10A serves as the front side of the reticle 10. The first side 10A receives an incident beam of a radiation source L1 in a determined incident angle. In some embodiments, the first side 10A reflects the incident radiation beam L1 to be a reflected radiation beam L2. The second side 10B serves as a back side of the reticle 10. In some embodiments, the back side does not receive any radiation or light source for photolithography. The substrate 102 is disposed on the back side 10B. The patterned layer 104 is disposed over the substrate 102 and on the front side 10A.

In some embodiments, the radiation or light beam L1 or L2 comprises a predetermined radiation form, such as a light source with wavelengths of 365 nm, 248 nm, 193 nm, 157 nm or 13.5 nm. In some embodiments, the reticle 10 is configured to use ultraviolet (UV) light as a light source in photolithography. In some embodiments, the radiation beam is formed of X-rays, electrons, or ions.

In some embodiments, the reticle 10 is a through-type reticle such that the substrate 102 may be transparent for passing the radiation or light. The substrate 102 may be formed of a suitable material, such as fused silica. In some embodiments, the reticle 10 is a reflective-type reticle such that the substrate 102 may be configured to reflect the exposure light. In some embodiments, the substrate 102 comprises a layered structure. For example, the substrate 102 may be formed of a backside material, a multilayer structure and a capping layer. The backside material is disposed on the backside 10B of the reticle 10. In some embodiments, the backside material is made of chromium nitride (CrN). In some embodiments, the multilayer structure is disposed over the backside material. The multilayer structure may comprise MoSi. In some embodiments, the capping layer is disposed over the multilayer structure and the backside material. In some embodiments, the capping layer is disposed between the multilayer structure and the patterned layer 104. In some embodiments, the capping layer is made of Ru and Si.

The patterned layer 104 is disposed over the substrate 102. The pattered layer 104 is configured to carry a predetermined circuit pattern and transform the same to a wafer surface. The patterned layer 104 may include hollow portions through which a radiation source may emit on the reticle 10. The radiation source may pass through the substrate 102 or be reflected by the substrate 102 depending on the reticle type. In the present embodiment, the patterned layer 104 is a reflective type. The reticle 10 may comprise a light absorbing material or anti-reflective coating layer at a surface of the front side 10A. The incident beam L1 impinges on the patterned layer 104, and a portion of the beam L impinges on the substrate 102 at a surface 104A through the hollow portions. Only the beam portion received at the surface 104A is reflected and forms the reflected beam L2. The remaining portion of the radiation beam not reflected is absorbed by the absorbing material of the patterned layer 104. In some embodiments, the absorbing material may comprise TaBO, TaBN, TaN, TaNO, Ni, Au, Ag, C, Te, Pt, Pd or Cr.

Referring to FIG. 1, a first foreign particle P1 and a second foreign particle P2 appear above the front side 10A of the reticle 10. The particle P1 or P2 may appear in the traveling path of the radiation beam L1 toward the reticle 10. Alternatively, the particle P1 or P2 may appear in the traveling path of the radiation beam L2 reflected from the reticle 10. In some embodiments, the particle P1 or P2 may be proximal to the reticle 10. The particles P1 and P2 may land on or attach to the front side 10A or another surface of the reticle 10. In some embodiments, the particle P1 or P2 may obstruct a portion of the transmission path of the beam L or L2, respectively. Therefore, the light-transformed patterns which correspond to the defined circuit patterns on the patterned layer 104 may be distorted or blurred. The situation may be worse as the particle size is comparable to the line width of the patterns.

The reticle shielding apparatus 100 is configured to generate a field shield which expels away the particles P1 and P2 proximal to the reticle 10 by using a type of field energy. In some embodiments, the field energy may be a magnetic field or an electric field. In some embodiments, the foreign particle P1 or P2 may exhibit magnetic characteristics, such as ferromagnetism, diamagnetism or paramagnetism. The reticle shielding apparatus 100 is configured to move the magnetic particle P1 or P2 away from the reticle 10 by using a magnetic field. The working principle for the translation of the magnetic particles P1 and P2 is referred to as magnetokinetics.

Still referring to FIG. 1, the field generator 20 is disposed around the reticle 10. The field generator 20 is configured to generate a magnetic field shield around the reticle 10. In some embodiments, the field generator 20 may be composed of one of a first field generator 202 and a second field generator 204. In some embodiments, the field generator 20 may comprise both the first field generator 202 and the second field generator 204. The first field generator 202 may surround the reticle 10 from a lateral side thereof. In some embodiments, there are at least two first field generators 202 surrounding the reticle 10. The first field generators 202 are configured to generate a first magnetic field collectively above the patterned layer 104 as illustrated by a representative magnetic field line F1. The first magnetic field F1 generated by the first field generators 202 covers at least a portion of space over the patterned layer 104. In addition, the first magnetic field F possesses a distribution of field directions and corresponding field strengths. An arrow labeled along with the magnetic field line F1 signifies the direction of first magnetic field at the position where the arrow resides. The field strength of the first magnetic field produced by the first field generators 202 is usually represented by the density of the field lines F1. For ease of illustration, only one magnetic field line F1 is shown in FIG. 1. Those having skill in the art would appreciate that more magnetic field lines F1 can be illustrated for representing the field strength of the first magnetic field.

In some embodiments, the second field generator 204 is disposed against the second side 10B of the reticle 10. In some embodiments, the second field generator 204 is disposed opposite to the patterned layer 104 with respect to the substrate 102. In some embodiments, the second field generator 204 may be in contact with the reticle 10. In some embodiments, a gap or intervening component may be present between the second field generator 204 and the reticle 10 such that the second field generator 204 and the reticle 10 are not in contact with each other.

The second field generators 204 are configured to generate a second magnetic field above the patterned layer 104, as illustrated by a representative magnetic field line F2. The second magnetic field F2 generated by the second field generator 204 covers at least a portion of space over the patterned layer 104. The first magnetic field F1 and the second magnetic field F2 may be at least partially overlapped. In addition, the second magnetic field F2 possesses a distribution of field directions and corresponding field strengths. An arrow labeled along with the magnetic field line F2 signifies the corresponding magnetic field direction at that position. The field strength of the magnetic field produced by the second field generator 204 is usually represented by the density of the field lines in the field. For ease of illustration, only one magnetic field line F2 is shown in FIG. 1. Those having skill in the art would appreciate that more than one magnetic field line F2 could be illustrated for representing the field strength. In some embodiments, the second magnetic field F2 may have a different distribution from that of the first magnetic field F1.

In the present embodiment, the particles P1 and P2 are exposed to the radiation L1 and may carry electrostatic charges. In alternative embodiments the radiation source L1 comprises an extreme ultraviolet (EUV) light with a relatively high energy, for example, up to 92 eV. In such a strong radiation source, the particle P1 or P2 may be ionized due to the photoelectric effect. In some embodiments, a neutral particle P1 or P2 may be transformed into a dipole, and exhibit an electric polarity accordingly. At the same time, the particle P1 or P2 may experience a composite magnetic field composed of the first magnetic field F1 or the second magnetic field F2 when those particles enter the magnetic field space over the patterned layer 104. As a result, the dipolar particle P1 or P2 traveling along a direction toward the front side 10A of the reticle 10 may experience a Lorentz force and would be redirected away from the front side 10A along another direction in compliance with the law of Lorentz force.

In some embodiments, the first field generator 202 or the second field generator 204 is configured to produce a magnetic field away from the front side 10A of the reticle 10. In addition, such magnetic field distributed away from the front side 10A is negligible as compared to the magnetic field F1 or F2 over the front side 10A. The term "negligible" in the present disclosure is referred to as being relatively small in terms of value or number. In some embodiments, a negligible strength may be interpreted as less than 10% of a referenced strength. In some embodiments, a negligible strength may be interpreted as less than 1% of a referenced strength. In some embodiments, a negligible strength may interpreted as less than 1 ppm (part per million) of a referenced strength. In some embodiments, a negligible strength may be referred to be of substantially zero value based on industrial standards.

In some embodiments, the reticle shielding apparatus 100 may comprise a power storage unit 50. The power storage unit 50 may be configured to provide energy for supplying power to the field generator 20. The power storage unit 50 may be electrically coupled to the first field generator 202 or the second field generator 204. The power storage unit 50 may be a battery or an electric power generator. Alternatively, the reticle shielding apparatus 100 may comprise an electrical connection 40. The electrical connection 40 is configured to transmit power to the field generator 20. The electrical connection 40 may be formed of a suitable conductive material. In some embodiments, the power storage unit 50 may be coupled to the field generator 20 through the electrical connection 40.

FIGS. 2A through 2D are schematic views of a reticle shielding apparatus 301 through 304, respectively, in accordance with some embodiments of the present disclosure. Specifically, FIGS. 2A through 2D illustrate schematic top views of the first field generators 301 through 304, respectively. In addition, several arrows are marked and each of the arrows represents a polarity direction of the respective magnetic field. As illustrated below FIGS. 2A and 2B, an exemplary magnet may have a respective pole pair comprising a north pole and a south pole. The pole pair serves to generate a magnetic field represented by field lines. Each of the magnetic field lines forms a closed loop as illustrated by the magnetic field line F1 or F2 of FIG. 1. The closed-loop field line F1 or F2 includes a field direction starting from the north pole, passing external to the magnet and toward the south pole, and returning to the south pole. Furthermore, the field line indicates a polarity direction pointing from the south pole to the north pole within the magnet. The direction for each of the arrows illustrated in FIGS. 2A through 2D represents the polarity direction of the magnetic field in the neighboring area where the arrow resides.

Referring to FIG. 2A, the reticle shielding apparatus 301 comprises the reticle 10 (not separately labeled) and a first field generator 310. In addition, the reticle 10 includes the substrate 102 and the patterned layer 104. The first field generator 310 surrounds the reticle 10. In some embodiments, the first field generator 310 is disposed around the substrate 102 such that the surface 102A of the substrate 102 is exposed. In alternative embodiments, the first field generator 310 may be disposed around the patterned layer 104 and covers a portion of the surface 102A. In some embodiments, the first field generator 310 may be in contact with or physically separated from the reticle 10.

In some embodiments, the first field generator 310 conformally fits the lateral profile of the reticle 10. In some embodiments, the first field generator 310 comprises a polygonal shape, such as a triangle, quadrilateral, hexagon or the like. In some embodiments, the first field generator 310 comprises a rectangular or square shape. In alternative embodiments, the first field generator 310 comprises a circular shape, such as a round or elliptic shape. In some embodiments, the first field generator 310 comprises a hollow portion at the center. In some embodiments, the first field generator 310 comprises a rim shape.

The first field generator 310 is configured to generate magnetic force. In some embodiments, the first field generator 310 comprises a ferromagnetic element. For example, the first field generator 310 includes a permanent magnet. In some embodiments, the first field generator 310 may comprise magnetic elements, such as iron, nickel, cobalt and alloys of rare earth metals. In some embodiments, the first field generator 310 comprises an electromagnet. For example, the first field generator 310 may include a coil. In some embodiments, the first field generator 310 comprises a power source or conductor coupled to the coil and configured to supply electrical power. The first field generator 310 may be configured to generate magnetic force by passing current through the coil of the electromagnet.

The magnetic field distributed over the patterned layer 104 may be controlled based on different materials, configurations and parameters determined for the first field generator 310. Referring to FIG. 2A, the first field generator 310 is configured to generate a predetermined magnetic field distribution. In some embodiments, the predetermined magnetic field distribution is generated through a superposition of several component magnetic fields, e.g., a component field C1, of different components or areas of the first magnetic generator 310. In the present embodiment, the first magnetic generator 310 may be divided into multiple, possibly eight, neighboring areas. Each of the possibly eight areas is configured to provide a component magnetic field, e.g., C1 through C8. Each of the component magnetic fields has a respective polarity direction internal of the first magnetic generator 310, as marked by the corresponding arrow. In addition, each of the component magnetic fields C1 through C8 is described with field coverage around the neighboring area of a circle enclosing the corresponding arrow.

Referring to FIG. 2A, the first field generator 310 comprises a first side S1, a second side S2, a third side S3 and a fourth side S4. The first side and the third side are opposite to each other, and the second side and the fourth side are opposite to each other. The first side or the third side is disposed substantially perpendicular to the second side or the fourth side. Moreover, the first field generator 310 is configured to generate component fields C2, C4, C6 and C8 on the first side, the second side, the third side and the fourth side, respectively. The component field C2 on the first side includes a polarity direction D1 pointing toward 270 degrees, where the reference of zero degrees is coincident with the positive direction of the x-axis. The polarity direction D1 is substantially equal to that of the component field C6 on the third side. Furthermore, the component field C4 on the third side includes a polarity direction D2 pointing toward 90 degrees. The polarity direction D2 is substantially equal to that of the component field C8 on the fourth side. The polarity direction D1 is substantially opposite to the polarity direction D2. In some arrangements, the polarity direction D1 on the first side S1 and the third side S3 is opposite to the polarity direction D2 on the second side S2 and the fourth side S4. Such arrangement may help in increasing the field strength over the front side 10A of the reticle 10 while managing the composite field strength below the back side 10B. Thus, the field distribution may be more concentrated and thus more effective in forming a field shield against foreign particles over the front side 10A of the reticle 10.

In some embodiments, the first field generator 310 is further configured to generate component fields C1, C3, C5 and C7 at four corners thereof, respectively. In some embodiments, each of the component fields C1, C3, C5 and C7 comprises a polarity direction D3 different from the polarity directions D1 and D2. In some embodiments, the component fields C1, C3, C5 and C7 may include a uniform polarity direction D3. In some embodiments, the component fields C1, C3, C5 and C7 may include different polarity directions, such as directing along 315 degrees, 225 degrees, 135 degrees and 45 degrees, respectively. There may be more than one configuration contributing to the polarity directions in FIG. 2A. Any components (such as magnets), materials and configurations that may constitute a polarity direction distribution similar to that of FIG. 2A are within the contemplated scope of the present disclosure.

FIG. 2B shows a schematic view of a reticle shielding apparatus 302 in accordance with some embodiments of the present disclosure. The reticle shielding apparatus 302 comprises a first field generator 302, configured to produce component fields C1, C3, C5 and C7 at the four corners thereof. Referring to FIGS. 2A and 2B, the polarity directions of the first field generator 302 is similar to those of the first field generator 301, except that the component fields C1, C3, C5 and C7 of the first field generator 302 includes at least one polarity direction D4 different from their counterparts of the first field generator 301, e.g., pointing toward zero degrees. In some embodiments, among the component fields C1, C3, C5 and C7, at least two of them may include a same polarity direction D4. For example, the component fields C1, C3, C5 and C7 of the first field generator 302 may point toward zero degrees, 180 degrees, zero degrees and 180 degrees, respectively. Such arrangement may help in increasing the field strength over the front side 10A of the reticle 10 while managing the composite field strength below the back side 10B. Thus, the field distribution may be more concentrated and thus more effective in forming a field shield against foreign particles over the front side 10A of the reticle 10.

Figure 2C:
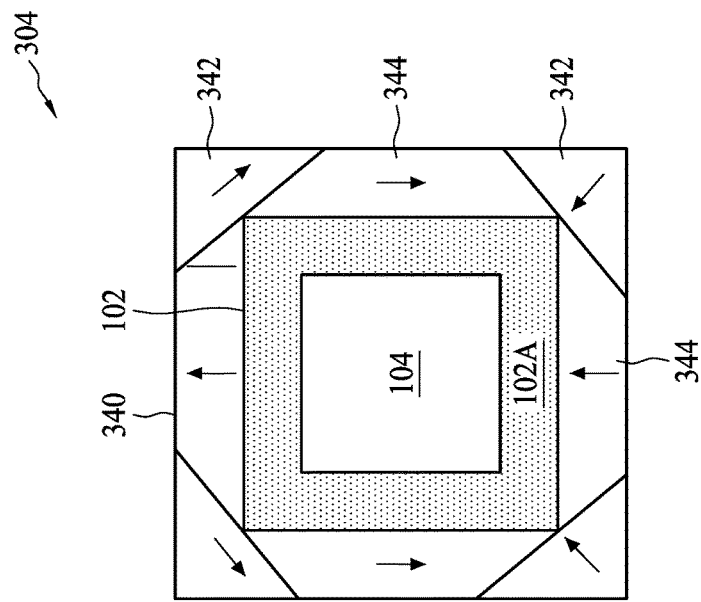

FIG. 2C shows a schematic view of a reticle shielding apparatus 303 in accordance with some embodiments of the present disclosure. The reticle shielding apparatus 303 comprises a first field generator 330 formed of several discrete magnetic elements, such as magnets 332. In some embodiments, the magnets 332 have an equal size and a similar shape. In some embodiments, at least one of the magnets 332 may comprise a quadrilateral shape, such as a rectangle or square. In some embodiments, at least one of the magnets 332 may comprise a triangular shape. The magnets 332 are configured to form at least one magnet strip (or one-dimensional array), e.g., the magnets 332-1, 332-5 and 332-6, of the first field generator 303. In some embodiments, each of the magnets 332 may be in contact with or physically separated from one another.

In some embodiments, each of the magnets 332 may be oriented to determine polarity directions thereof as desired. For example, magnets 332-1 may be oriented along a polarity direction D5 (i.e., pointing toward 270 degrees), magnets 332-2 may be oriented along a polarity direction D6 (i.e., pointing toward 90 degrees), magnets 332-3 may be oriented along the polarity direction D5 and magnets 332-4 may be oriented along the polarity direction D6. The magnets 332-1 and 332-3 are oriented with a same polarity direction D5. In addition, the magnets 332-1 and 332-2 are oriented with substantially opposite polarity directions.

Moreover, the first field generator 303 comprises magnets 332-5, 332-6, 332-7 and 332-8 disposed at four corners thereof, respectively. In some embodiments, the magnets 332-5, 332-6, 332-7 and 332-8 may be oriented along equal or different polarity directions. In some embodiments, at least one of the magnets 332-5, 332-6, 332-7 and 332-8 may be oriented along a polarity direction perpendicular to the polarity directions D5 and D6, such as pointing toward zero degrees or 180 degrees.

Figure 2D:
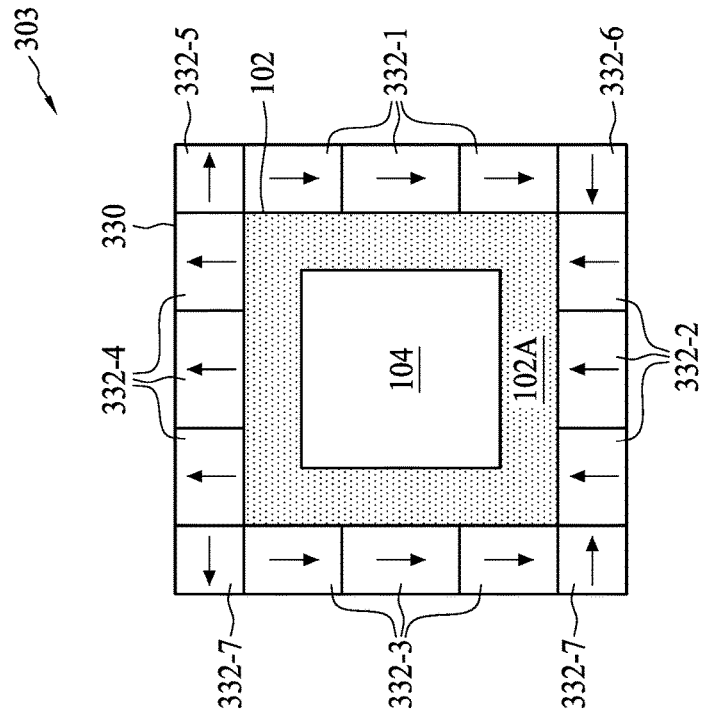

FIG. 2D shows a schematic view of a reticle shielding apparatus 304 in accordance with some embodiments of the present disclosure. The reticle shielding apparatus 304 comprises a first field generator 340. In some embodiments, the first field generator 304 comprises several discrete magnetic elements, such as magnets 342 and 344. In some embodiments, the first field generator 304 is composed of a first magnet group 342 and a second magnet group 344. The magnets 342 comprise a triangular shape from a top view while the magnets 344 comprise a quadrilateral shape, such as a trapezoid, from a top view. In some embodiments, the triangular magnets 342 are disposed around the corners of the first field generator 340. In some embodiments, one magnet 344 is disposed between two of the magnets 342. Similarly, one magnet 342 is disposed between two of the magnets 344. The polarity directions of magnets 342 or 344 may be arranged in a similar manner to those of the first field generator 301, 302 or 303.

Figure 3:
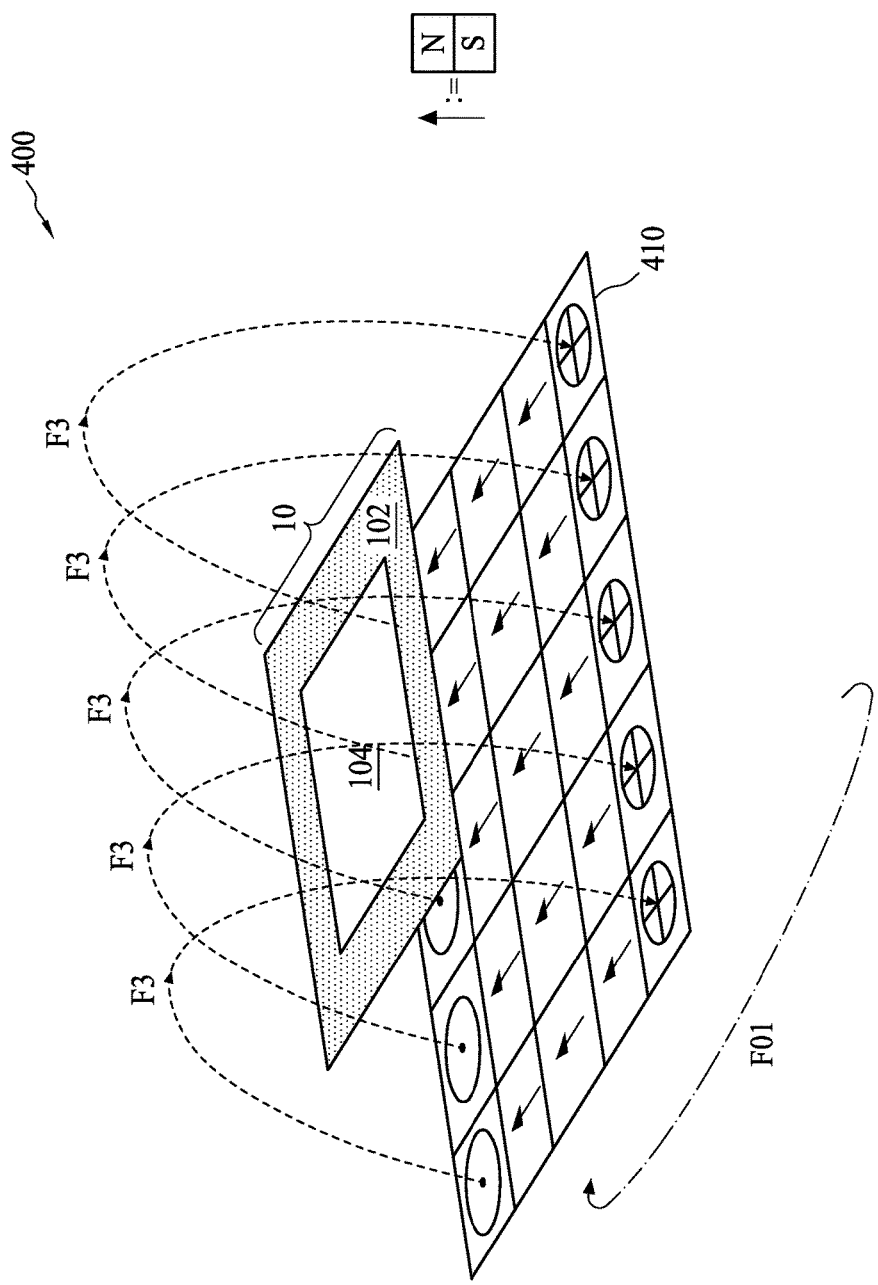
FIG. 3 is a schematic view of a reticle shielding apparatus in accordance with some embodiments of the present disclosure.

FIG. 3 is a perspective view of a reticle shielding apparatus 400 in accordance with some embodiments of the present disclosure. The reticle shielding apparatus 400 comprises the reticle 10 (not separately labeled), which comprises the substrate 102 and the patterned layer 104. In addition, the reticle shielding apparatus 400 comprises a second field generator 410. Referring to FIGS. 1 and 4, the second field generator 410 is disposed proximal to the back side 10B of the reticle 10. In some embodiments, the second field generator 410 is disposed against the substrate 102 of the reticle 10. In some embodiments, the second field generator 410 is formed of a two-dimensional array. In some embodiments, the second field generator 410 is facing the back side 10B of the reticle 10.

In some embodiments, the second field generator 410 is configured to generate magnetic force around the reticle 10. In some embodiments, the second field generator 410 is configured to produce a magnetic field distributed substantially over the front side 10A of the reticle 10, as illustrated by magnetic field lines F3. In some embodiments, the second field generator 410 is configured such that the produced magnetic field F01 in proximity to the back side 10B of the reticle 10 is negligible as compared to the magnetic field F3 over the front side 10A.

Figure 4A:
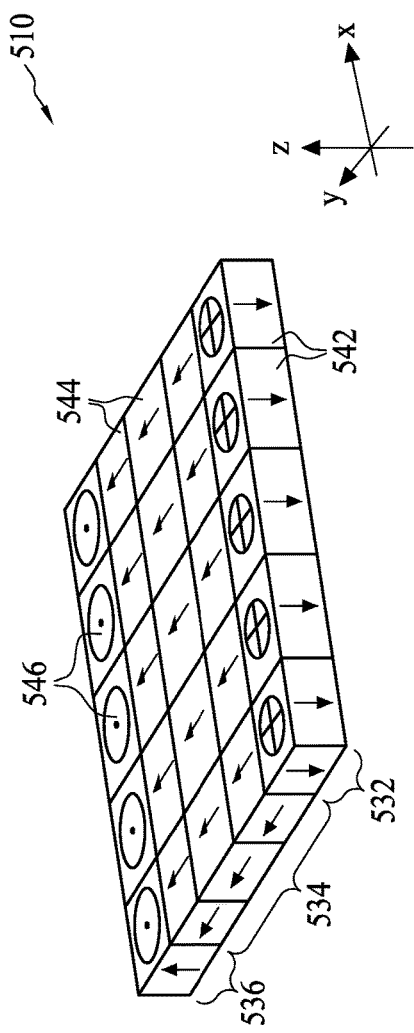
FIGS. 4A and 4B are schematic views of a field generator of the reticle shielding apparatus in FIG. 3, in accordance with some embodiments of the present disclosure.

FIG. 4A is a schematic view of a second field generator 510 in accordance with some embodiments of the present disclosure. In some embodiments, the second field generator 510 comprises several discrete magnetic elements, such as magnets 542, 544 and 546. In some embodiments, the magnets 542, 544 or 546 have a substantially equal size and a similar shape. In some embodiments, the magnets 542, 544 or 546 may comprise a quadrilateral shape from a cross-sectional view, such as a rectangle or square. In some embodiments, the magnets 542, 544 or 546 may comprise a quadrilateral shape from a top view, such as a rectangle or square. The magnets 542 are configured to form at least one magnet strip 532 (one-dimensional array) of the second field generator 510. Similarly, the magnets 544 and 546 are configured to form magnet strips 534 and 536, respectively. At least a portion of the magnets 544 form a two-dimensional array 534 of the second field generator 510. In some embodiments, magnets 542, 544 and 546 form a magnet matrix. In some embodiments, each of the magnets 542, 544 and 546 may be in contact with or physically separated from one another.

Referring to FIG. 4A, the second field generator 510 is oriented in reference to a Cartesian coordinate with an x-axis, a y-axis, and a z-axis. In addition, a cross symbol marked on a magnet in FIG. 4A represents a polarity direction of that magnet pointing toward a negative direction along the z-axis. Similarly, a dot symbol marked on a magnet in FIG. 4A represents a polarity direction of such magnet pointing toward a positive direction along the z-axis. In some embodiments, each magnet of the magnet strip 532 may be oriented in a uniform polarity direction. For example, magnets 542 may be oriented along a polarity direction D7 represented by the cross symbol. In some embodiments, each magnet of the magnet strip 536 may be oriented in a uniform polarity direction. For example, magnets 546 may be oriented along a polarity direction D8 represented by the dot symbol. In some embodiments, each magnet of the magnet array 534 may be oriented in a uniform polarity direction. For example, magnets 544 may be arranged to provide a polarity direction D9, where the direction D9 is pointing from the magnet array 532 toward the magnet array 536 along a top surface of the second field generator 510, i.e., the positive direction along the y-axis.

Figure 4B:
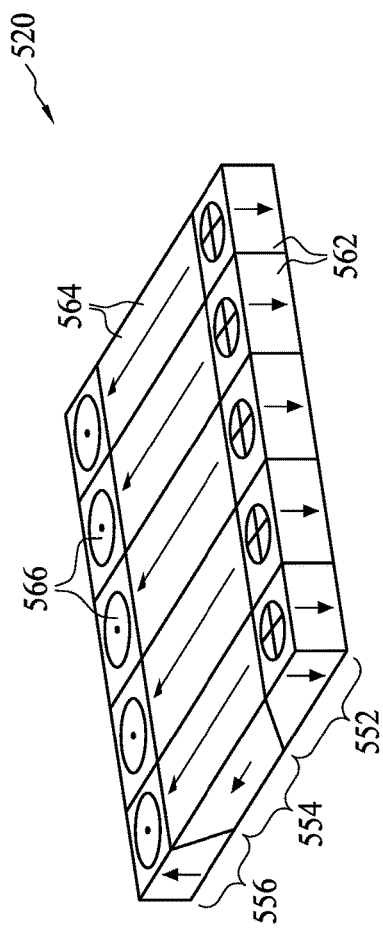

FIG. 4B is a schematic view of a second field generator 520 in accordance with some embodiments of the present disclosure. In some embodiments, the second field generator 520 comprises several discrete magnetic elements, such as magnets 562, 564 and 566. The magnets 562, 564 or 566 form magnet arrays 552, 554 and 556, respectively. In some embodiments, the magnets may comprise different shapes or geometries for different magnet arrays. For example, each of the magnets 562, 564 and 566 has a quadrilateral surface from a top view, a bottom view and a cross-sectional view. In some embodiments, each of the magnets 562, 564 and 566 has a rectangular or square surface from both a top view and a bottom view, while containing a trapezoidal surface from a cross-sectional view. In some embodiments, each of the magnets 562 and 566 has a bottom surface greater than a top surface. In some embodiments, each of the magnets 564 has a top surface greater than a bottom surface. In some embodiments, at least one of the magnets in the second field generator 520 comprises a wedge shape. The arrangements where at least one of the magnets 562 or 566 has a bottom surface greater than a top surface may generate a greater magnetic field over the front side 10A of the reticle 10.

Figure 5:
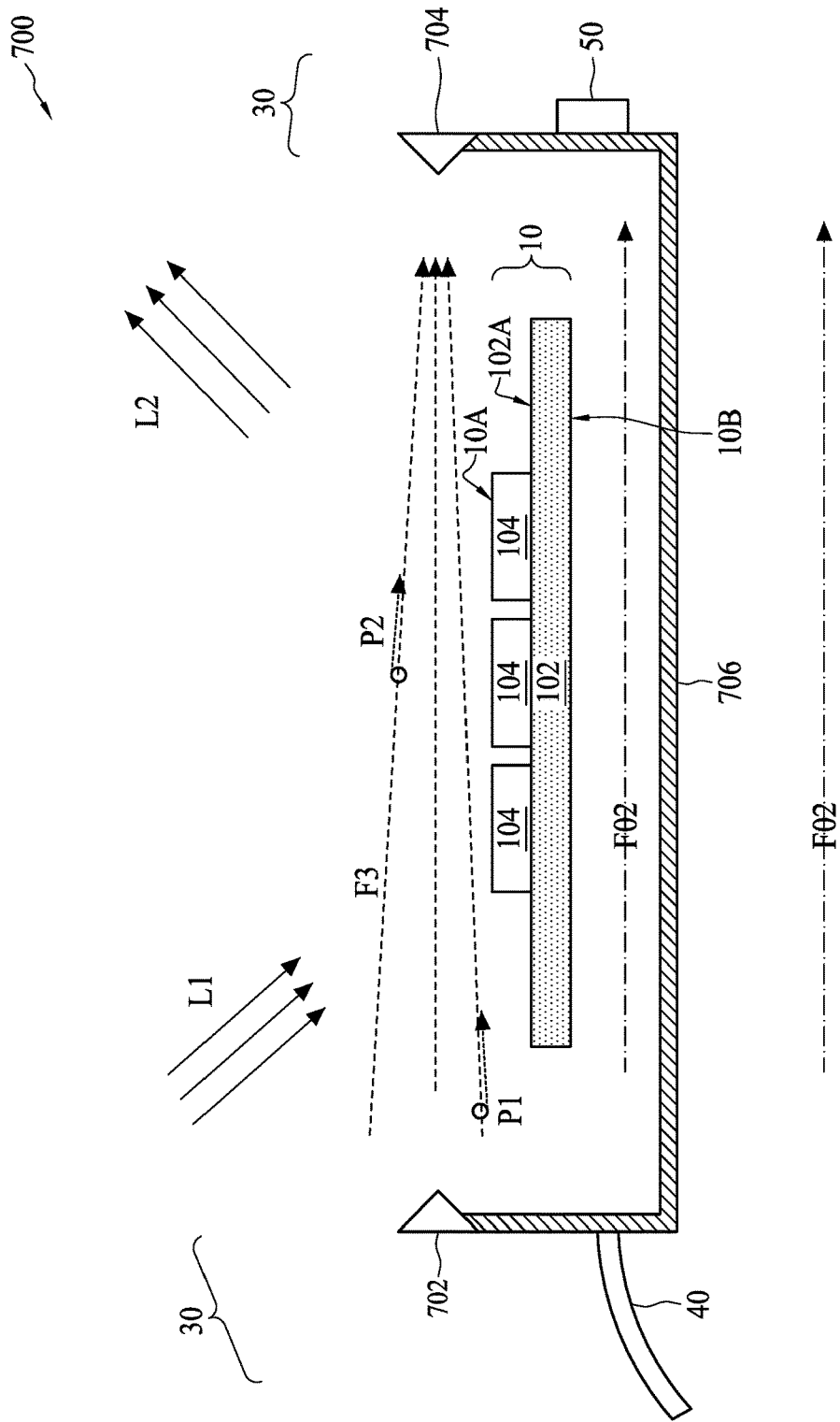
FIG. 5 is a schematic view of a reticle shielding apparatus in accordance with some embodiments of the present disclosure.

FIG. 5 is a schematic view of a reticle shielding apparatus 700 in accordance with some embodiments of the present disclosure. The reticle shielding apparatus 700 comprises a reticle 10 and a field generator 30.

Referring to FIGS. 1 and 5, the field shielding apparatus 700 comprises the field generator 30 instead of the field generator 20. In some embodiments, the field generator 30 is configured to generate a field shield, such as an electric field. In some embodiments, the field generator 30 is configured to produce an electric field shield around the reticle 10. In some embodiments, the field generator 30 is configured to produce an electric field shield substantially distributed across a space over the front side 10A of the reticle 10, as illustrated by electric field lines F4. In some embodiments, the field generator 30 is configured such that the produced magnetic field F02 in proximity to the back side 10B of the reticle 10 is negligible as compared to the magnetic field F4 over the front side 10A.

In some embodiments, the foreign particle P1 is charged. In some embodiments, the field generator 30 is configured to move the charged particle P1 away from the reticle 10. For example, the field generator 30 is configured to generate a Coulomb force for moving the charged particle P1. The Coulomb force is determined based on parameters of the particle P1, such as mass, velocity and charge quantity thereof, as well as the electric field strength (represented by the field lines F4) provided by the field generator 30.

In some embodiments, the foreign particle P2 is neutral. In some embodiments, the field generator 30 is configured to charge or polarize the neutral particle P2. In some embodiments, the neutral particle P2 within the space of the electric field shield provided by the field generator 30 may be polarized to be an electric dipole. In some embodiments, the field generator 30 is configured to provide a drift force against a charged or polarized particle and move the same away from the reticle 10. In some embodiments, the field generator 30 is configured to provide a non-uniform electric field for generating an electric force, such as a drift force. The direction and strength of the drift force are determined based on a gradient vector of the generated electric field (represented by the field lines F4) and polarizability factor with respect to the charged particle.

In some embodiments, the field generator 30 is formed of a capacitor. The capacitor 30 may comprise a first electrode 702 and a second electrode 704. The first electrode 702 and the second electrode 704 are disposed on opposite sides with respect to the reticle 10. In some embodiments, the first electrode 702 has a first surface facing a second surface of the second electrode 704, both of the surfaces being referred to as capacitive areas of the field generator 30. In one embodiment, the first surface and the second electrode 704 have substantially equal capacitive areas. The resultant electric field F4 includes a uniform distribution accordingly.

In an alternative embodiment, the first surface has a shape different from that of the second surface. In one embodiment, the first surface or the second surface may comprise a flat surface, a curved surface or a vertex. In some embodiments, the first surface or the second surface may comprise corrugations. Thus, the first surface may have a different capacitive shape from the second surface even though both the first surface and the second surface have substantially equal capacitive areas. In cases where the first surface has a different capacitive area or capacitive shape from the second surface, the resultant electric field F4 may include a non-uniform distribution.

In some embodiments, the field generator 30 may comprise a member 706. In some embodiments, the member 706 is facing the substrate 102 of the reticle 10. In some embodiments, the member 706 is configured to couple the first electrode 702 and the second electrode 704. The member 706 may be made of electrically insulating or conductive materials.

In some embodiments, the reticle shielding apparatus 700 may include a power storage unit 50 or an electrical connection 40 coupled to the field generator 30. The power storage unit 50 or the electrical connection 40 is configured to supply power to the field generator 30 whereby an electric field can be established.

Figure 6:
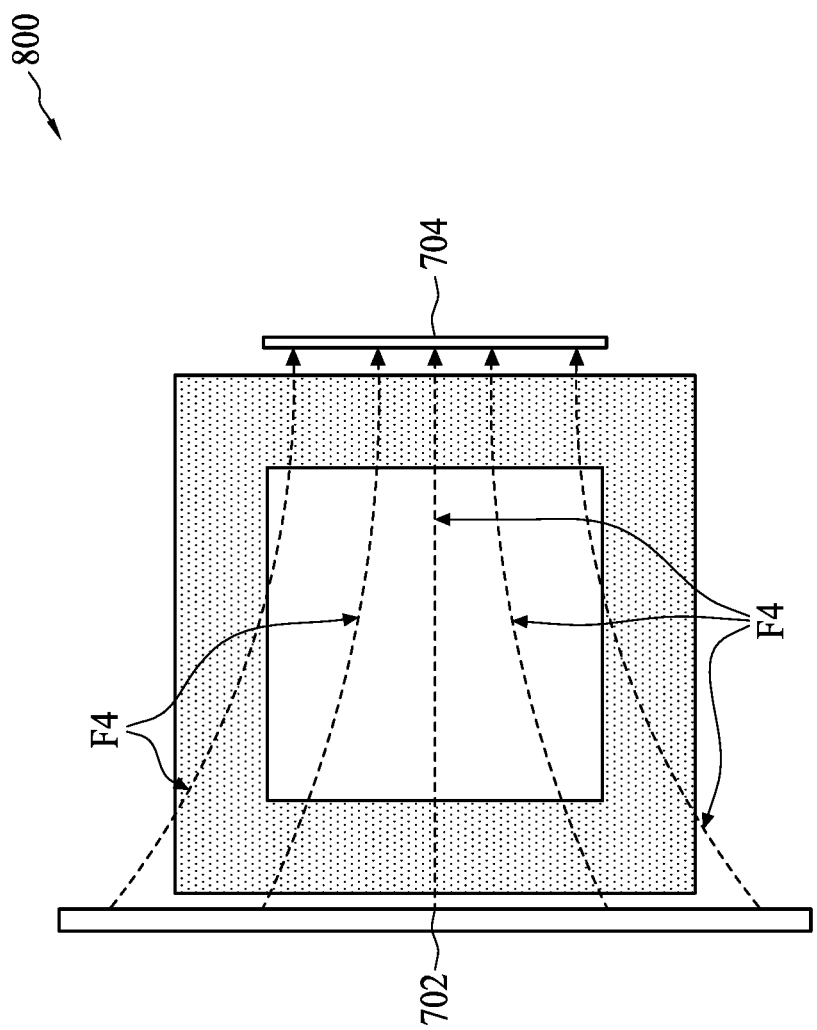
FIG. 6 is a schematic view of a reticle shielding apparatus in accordance with some embodiments of the present disclosure.

FIG. 6 is a schematic top view of the reticle shielding apparatus 800 in accordance with some embodiments of the present disclosure. In the present embodiment, the first electrode 702 has a larger capacitive area than that of the second electrode 704. Thus, the electric field lines F4 are distributed in a non-uniform manner.

Figure 7:
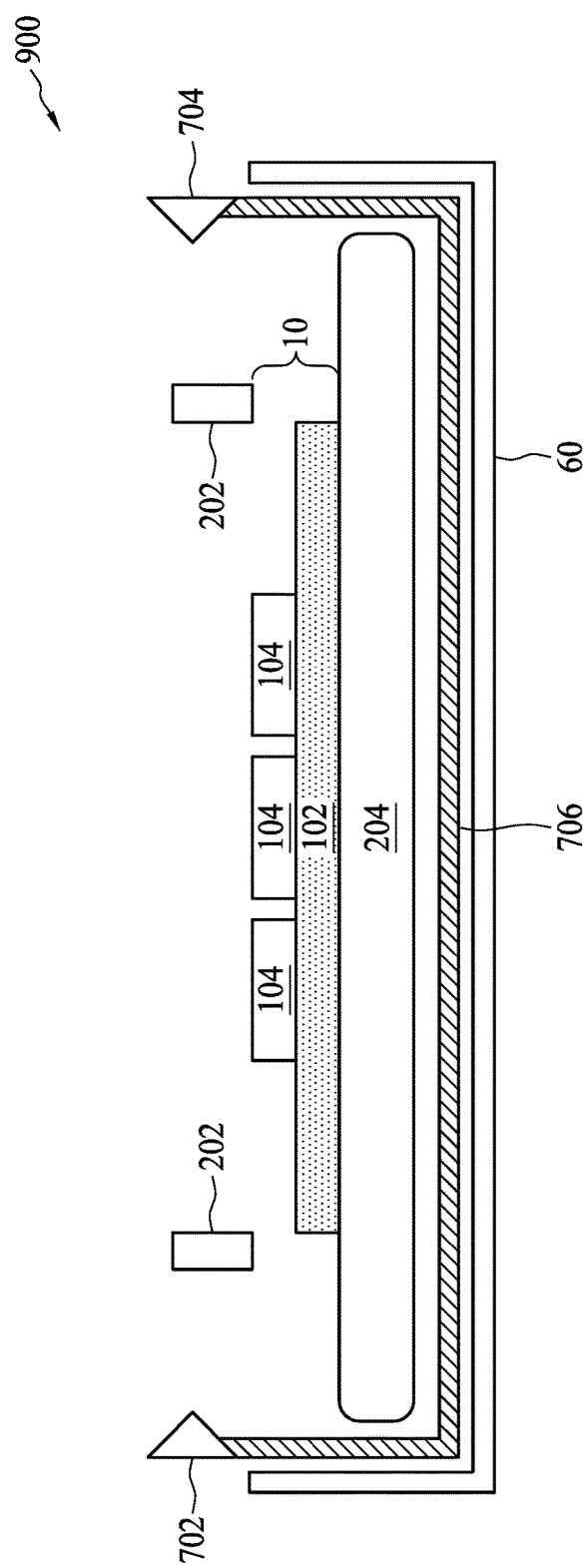
FIG. 7 is a schematic view of a reticle shielding apparatus in accordance with some embodiments of the present disclosure.

FIG. 7 is a schematic view of a reticle shielding apparatus 900 in accordance with some embodiments of the present disclosure. The reticle shielding apparatus 900 comprises the magnetic field generator 20 and the electric field generator 30, configured to generate a magnetic field and an electric field, respectively. In some embodiments, the magnetic field generator 20 may comprise one of the first field generator 202 and the second field generator 204. In some embodiments, the magnetic field generator 20 may comprise both the first field generator 202 and the second field generator 204. In some embodiments, the reticle shielding apparatus 900 comprises a shielding member 60, configured to shield the magnetic field from other nearby components or equipment involving manipulation of electromagnetic energy. In some embodiments, the shielding member 60 is disposed between the field generator 20 and the field generator 30. In some embodiments, the shielding member 60 is integrated into the field generator 30. In some embodiments, the shielding member 60 surrounds the field generator 30. The shielding member 60 may be formed of a high permeability material, such as metal.

Figure 8:
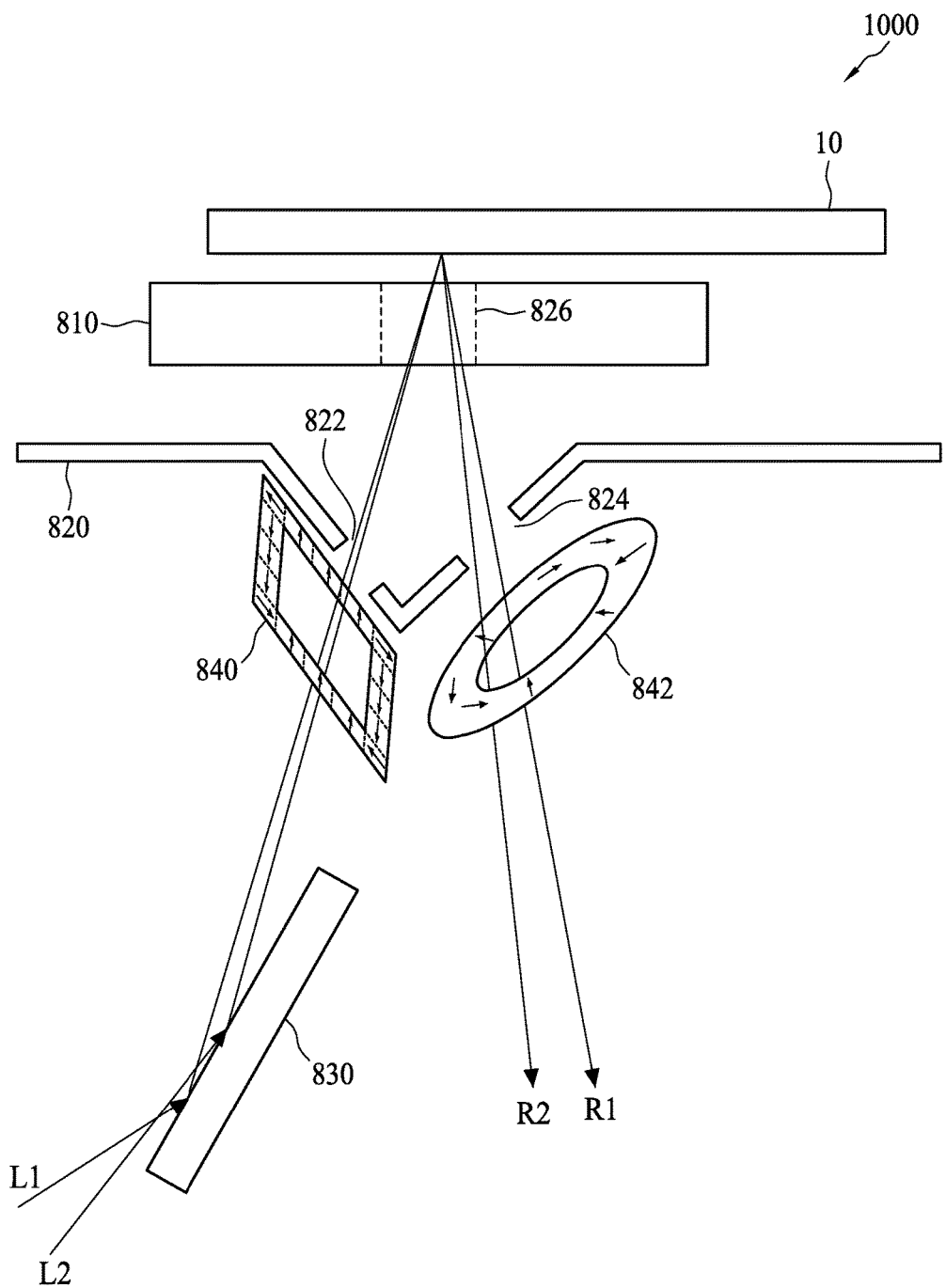
FIG. 8 is a schematic view of a system in accordance with some embodiments of the present disclosure.

FIG. 8 is a schematic view of a system 1000 in accordance with some embodiments of the present disclosure. The system 1000 is configured to generate a lithography pattern for fabricating features of semiconductor devices or elements. In an embodiment, the system 1000 comprises a lithography system, such as an EUV scanner system. Referring to FIG. 8, the system 1000 comprises a reticle 10, a shutter 810, an optical device 820, an optical modulator 830, and field generators 840 and 842.

In some embodiments, the lithographic pattern is transferred in the form of patterned radiation beams. To accomplish the pattern transferring, the system 1000 is configured to receive the radiation beam L1 or L2 from a radiation source (not separately shown) and form a lithographic pattern through the reticle 10. In some embodiments, the system 1000 comprises the radiation source or the radiation source is external to the system 1000. The reticle 10 comprises components similar to those illustrated in descriptions with reference to FIGS. 1, 5 and 7, and details of the reticle 10 are not repeated here.

The system 1000 is further configured to deliver the radiation beam before or after the pattern is formed through optical elements, such as the optical modulator 830. For example, the optical modulator 830 is configured to receive an impinging incident radiation beam L1 or L2 from the radiation source. In some embodiments, the aperture comprises lenses. In an embodiment, the optical modulator 830 comprises a reflector or collimator configured to reflect or collimate incident radiation. In addition, the system 1000 is configured to form a light path before or after the lithographic pattern is generated through apertures of at least one optical element, such as the optical device 820 or the shutter 810. As a result, a lithographic pattern defined by the reticle 10 is transferred to a subsequent optical element or a target wafer (not separately shown) through a reflected beam R1 or R2.

The optical device 820 comprises at least one aperture configured to pass the radiation beam to the target wafer. For example, the optical device 820 is configured to redirect or process the incident radiation beam L1, L2 passing through an aperture 822. In some embodiments, the optical device 820 may comprise an illumination device. Furthermore, the system 1000 comprises a field generator 840 around the aperture 822. The field generator 840 is configured to shield the light path around the aperture 822 from being obstructed or blocked by foreign particles. Effectively, the transmission path for the radiation beam can be cleared from particle contamination or obstruction. In some embodiments, the field generator 840 may be implemented similarly to the field generator 20 or 30 with reference to FIGS. 1, 5 and 7 and details thereof are not repeated here.

In another embodiment, the optical device 820 is configured to process (after the beam pattern is formed) the reflected light R1 or R2 passing from the reticle 10 and directed through another aperture 824. In some embodiments, the optical device 820 may comprise an imaging device. Furthermore, the system 1000 comprises a field generator 842 around the aperture 824. The field generator 842 is configured to shield the light path around the aperture 824 from being obstructed or blocked by foreign particles. In some embodiments, the field generator 842 may be implemented similarly to the field generator 20 or 30 with reference to FIGS. 1, 5 and 7 and details thereof are not repeated here.

In some embodiments, the system 1000 may comprise a controllable aperture formed of a shutter 810. For example, the shutter 810 is configured to allow the incident light L1 or L2 to pass through and emit to the reticle 10. The shutter 810 comprises an aperture 826 (not explicitly shown while marked with dashed lines in FIG. 8) and is configured to determine a shutter speed so as to control the amount of radiation L1 or L2 passing onto the reticle 10.

The shutter 810 comprises at least one shutter leaf. In some embodiments, the shutter leaf may be composed of an opaque material and is configured to control the amount of light passing through the aperture 826. In some embodiments, the shutter 810 may be a diaphragm shutter which comprises a plurality of overlapped leaves. In some embodiments, the plurality of leaves comprise a blade shape. Other types of shutter 810, such as a focal-plane shutter or an electronic shutter, are also within the contemplated scope of the present disclosure. In some embodiments, the system 1000 comprises a reticle masking (REMA) blade system having the shutter 810.

Figure 9B:
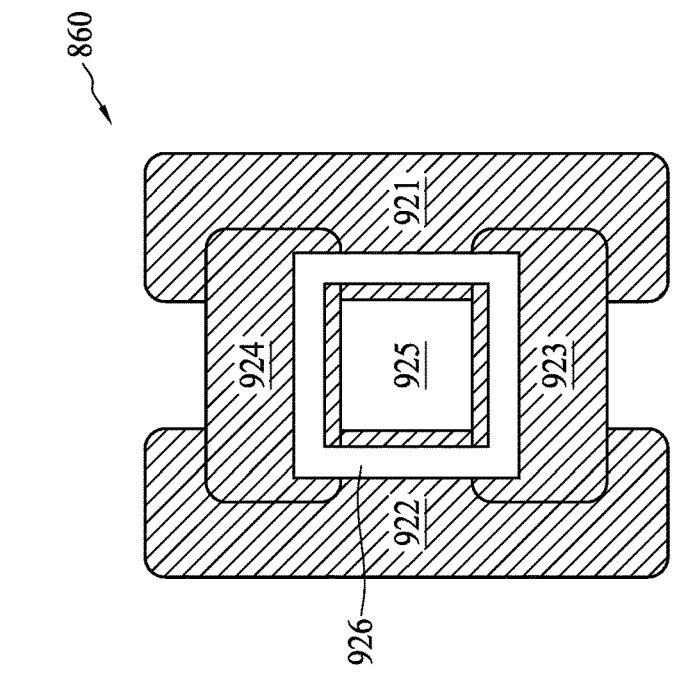
FIGS. 9A and 9B are schematic views of a shutter of the system of FIG. 8, in accordance with some embodiments of the present disclosure.
Figure 9A:
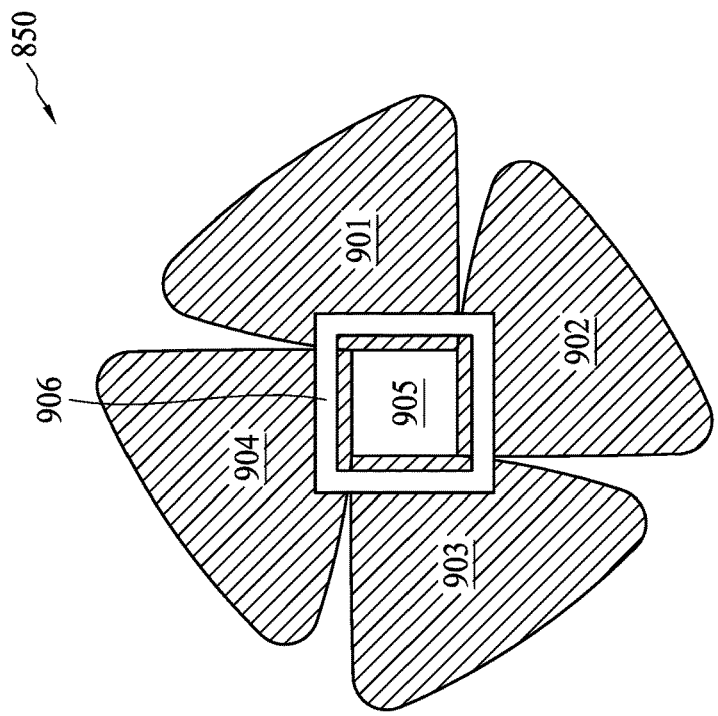

FIG. 9A is a schematic view of a shutter 850 of the system 1000 of FIG. 8A, in accordance with some embodiments of the present disclosure. The shutter 850 comprises a first shutter leaf 901, a second shutter leaf 902, a third shutter leaf 903 and a fourth shutter leaf 904. The shutter leaves 901, 902, 903 and 904 are collectively controlled to form an aperture 905. Alternatively, the aperture 905 is surrounded by the shutter leaves 901, 902, 903 and 904 when the shutter 850 is opened. In some embodiments, the shutter 850 comprises a controller configured to manage the leaves 901, 902, 903 and 904 and the size of the aperture 905 accordingly. In the present embodiment, the leaves 901 through 904 comprise a triangle-like shape with rounded corners. Nevertheless, the aforementioned leaves 901 through 904 may comprise other suitable shapes, such as a polygon shape. Moreover, the leaves 901 through 904 may comprise straight or curved edges, and straight or rounded corners. The number of the leaves 901 through 904 for the shutter 850 and the shapes shown in FIG. 8 are for illustration. Other numbers and shapes of the shutter leaves of the shutter 850 are within the contemplated scope of the present disclosure.

The shutter 850 further comprises a field generator 906, configured to shield the light path around the aperture 905 from undesired particles. In some embodiments, the field generator 906 is configured to generate a magnetic field and/or an electric field around the aperture 905. In some embodiments, the field generator comprises a shape matching the edges of the leaves 901 through 904 close to the aperture 905. In some embodiments, the field generator 906 comprises a rim shape or a quadrilateral shape depending on the opening shape of the aperture 905.

In some embodiments, the leaves 901, 902, 903 and 904 may be moved or pivoted so as to determine the size of the aperture 905. In that case, the field generator 906 may comprise more than one field generating elements (not explicitly shown) corresponding to the leaves of the shutter 850. The field-generating elements are configured to move along with the movements of the corresponding shutter leaves. In some embodiments, the field generating elements may be separate from one another. In some embodiments, the field-generating elements comprise a stripe shape or quadrilateral shape.

FIG. 9B is an schematic view of a shutter 860 of the system 1000 in accordance with some embodiments of the present disclosure. The shutter 860 comprises a first shutter leaf 921, a second shutter leaf 922, a third shutter leaf 923 and a fourth shutter leaf 924. The shutter leaves 921, 922, 923 and 924 are configured to collectively form an aperture 925. Alternatively, the aperture 925 is surrounded by the shutter leaves 921, 922, 923 and 924. Comparing FIG. 9B with FIG. 9A, the leaves 921 through 924 comprise a quadrilateral shape with rounded corners. Other numbers and shapes for the shutter leaves are within the contemplated scope of the present disclosure.

The shutter 860 further comprises a field generator 926, configured to shield the light path of the radiation beam around the aperture 925 from undesired particles. In some embodiments, the field generator 926 is configured to generate a magnetic field and/or an electric field around the aperture 925. In some embodiments, the field generator comprises a shape matching the edges of the shutter leaves 921 through 924 close to the aperture 925. In some embodiments, the field generator 906 comprises a rim shape or a quadrilateral shape.

In some embodiments, the leaves 921, 922, 923 and 924 may be moved or pivoted so as to determine the size of the aperture 925. In that case, the field generator 926 may comprise more than one field generating elements (not explicitly shown) corresponding to the movable leaves of the shutter 860. The field-generating elements are configured to move along with the movements of the corresponding shutter leaves. In some embodiments, the field generating elements may be separate from one another. In some embodiments, the compartmented field-generating elements comprise a stripe shape or quadrilateral shape.

The present disclosure provides an apparatus. The apparatus comprises a field generator, configured to produce a field shield protecting a reticle from foreign particles.

The present disclosure provides an apparatus for reticle shielding. The apparatus comprises a reticle and a magnetic field generator around the reticle. The magnetic field generator is configured to produce a magnetic field over the reticle.

The present disclosure provides an apparatus for reticle shielding. The apparatus comprises a reticle and an electric field generator around of the reticle. The electric field generator is configured to produce an electric field over the reticle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus, comprising a field generator, configured to produce a field shield protecting a reticle from foreign particles,
   wherein the field generator comprises a plurality of magnetic elements each being a permanent magnet and including a magnetic north pole and a magnetic south pole that generate a magnetic field as part of the field shield, and
   wherein the magnetic north pole and the magnetic south pole of a first magnetic element of the plurality of magnetic elements define a first polarity direction, the magnetic north pole and the magnetic south pole of a second magnetic element of the plurality of magnetic elements define a second polarity direction, the first and second polarity directions are opposite but both perpendicular to a back side of the reticle, the first and second magnetic elements being on two opposing sides of the reticle.

2. The apparatus according to claim 1, wherein the field generator is further configured to cause particles proximal to the reticle to be ferromagnetically, diamagnetically or paramagnetically magnetized by the field shield such that the particles move away from the reticle.

3. The apparatus according to claim 1, wherein the plurality of magnetic elements surrounds the reticle, each of the plurality of magnetic elements oriented in a particular polarity direction with respect to the reticle.

4. The apparatus according to claim 1, wherein the field generator is configured to cause particles proximal to the reticle to be polarized or ionized by the field shield.

5. The apparatus according to claim 4, wherein the field generator is configured to also generate an electric field.

6. The apparatus according to claim 1, wherein the reticle comprises a patterned layer on a first side, and the field shield is distributed substantially over the first side.

7. The apparatus according to claim 6, wherein the reticle comprises a second side opposite to the first side, and the field generator is configured to produce a negligible field in proximity to the second side.

8. The apparatus according to claim 1, wherein the reticle is configured to reflect an ultraviolet light and transform a predetermined pattern.

9. The apparatus according to claim 1, further comprising an electrical connection or power storage unit, configured to supply power to the field generator.

10. An apparatus for reticle shielding, the apparatus comprising:
a reticle;
a first magnetic field generator around the reticle, the first magnetic field generator comprising one or more magnets each including a magnetic north pole and a magnetic south pole configured to produce a first magnetic field around the reticle, wherein the magnetic north pole and the magnetic south pole of each of the one or more magnets of the first magnetic field generator define a first polarity direction parallel to a back side of the reticle, wherein the first magnetic field generator comprises a rim array enclosing and exposing the reticle; and
a second magnetic field generator, the second magnetic field generator comprising one or more magnets each including a magnetic north pole and a magnetic south pole configured to produce a second magnetic field different from the first magnetic field, wherein the magnetic north pole and the magnetic south pole of at least one of the one or more magnetics of the second magnetic field generator define a second polarity direction substantially perpendicular to the back side of the reticle.

11. The apparatus according to claim 10, wherein the reticle comprises a substrate and a patterned layer over the substrate, and the first and second magnetic fields are substantially over the patterned layer.

12. The apparatus according to claim 10,
wherein the one or more magnets of the first magnetic field generator form a first magnet array and generate the first magnetic field, and
wherein the one or more magnets of the second magnetic field generator form a second magnet array and generate the second magnetic field.

13. The apparatus according to claim 12, wherein the second magnet array is facing a back side of the reticle.

14. The apparatus according to claim 12, wherein at least one of the one or more magnets of the second magnetic field generator comprises a top surface and a bottom surface, the top surface being greater than the bottom surface.

15. The apparatus according to claim 12, wherein at least one of the one or more magnets of the second magnetic field generator comprises a trapezoid shape from a cross-sectional view.

16. The apparatus according to claim 10, configured to generate a first component field pointing toward a third polarity direction, and a second component field pointing toward a fourth polarity direction opposite to the third polarity direction.

17. A system for generating a lithographic pattern, the system comprising:
a radiation source configured to emit a radiation toward a reticle;
an aperture for the radiation passing therethrough; and
a field generator configured to generate a field so as to shield the aperture from foreign particles, the field generator comprising one or more magnetic elements each including a magnetic north pole and a magnetic south pole that generate a magnetic field as part of the field, and
wherein the magnetic north pole and the magnetic south pole of at least one of the one or more magnetic elements define a polarity direction substantially perpendicular to a back side of the reticle, the at least one of the one or more magnetic elements being a permanent magnet.

18. The system according to claim 17, further comprising an optical illumination device or an optical image device having the aperture.

19. The system according to claim 17, further comprising a shutter configured to control the aperture.

20. The system according to claim 19, wherein the shutter comprises a plurality of leaves, and the field generator is disposed on at least one of the plurality of leaves.

21. The system according to claim 20, wherein the leaves comprise a blade shape.

22. The system according to claim 17, wherein the field generator comprises a plurality of magnetic elements surrounding the aperture, each of the plurality of magnetic elements oriented in a particular polarity direction with respect to the aperture.

23. The system according to claim 17, wherein the field further comprises an electric field.

24. The system according to claim 17, wherein the field generator is configured to allow the radiation to pass therethrough.

25. The system according to claim 17, wherein the field generator comprises a rim shape or a square shape.

* * * * *